US006436748B1

(12) United States Patent
Forbes et al.

(10) Patent No.: US 6,436,748 B1
(45) Date of Patent: Aug. 20, 2002

(54) METHOD FOR FABRICATING CMOS TRANSISTORS HAVING MATCHING CHARACTERISTICS AND APPARATUS FORMED THEREBY

(75) Inventors: Leonard Forbes, Corvallis, OR (US); Wendell P. Noble, Milton, VT (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/386,315

(22) Filed: Aug. 31, 1999

(51) Int. Cl.⁷ .................. H01L 21/8238; H01L 29/04
(52) U.S. Cl. ........................ 438/199; 257/627
(58) Field of Search ................... 257/627, 628; 438/200, 201, 199

(56) References Cited

U.S. PATENT DOCUMENTS 4,857,986 A * 8/1989 Kinugawa .................. 257/255
5,227,660 A * 7/1993 Horiuchi et al. ............ 257/588

OTHER PUBLICATIONS

Author Unidentified, On–line posting excerpt "2.2 The CMOS Process" from "Application–Specific Integrated Circuits" by Addison Wesley Longman, Inc. (http://www-ee.eng.hawaii.edu/~msmith/ASICs/HTML/Book2/CH02/CH02.2html), 1997.*
Pierret, Modular Series On Solid State Devices, vol. 1 "Semiconductor Fundementals" (p. 10) and vol. IV "Field Effect Devices" (pp. 1–5), 2nd Edition, Addison–Wesley Publishing Company, 1990.*
Streetman, Solid State Electronic Devices, 1990, Third Edition, Prentice Hall, pp. 88, 298–299 and 350–351.*
Zou et al., "In–Situ Stress State Measurements During Chip–on Board Assembly", IEEE Transactions on Electronics Packaging Manufacturing, vol. 22, No. 1, Jan. 1999, pp. 38–52.*
Muller & Kamins, Device Electronics For Integrated Circuits, 1986, John Wiley & Sons, Second Edition, pp. 36–38.*
Gray and Meyer, Analysis And Design Of Analog Integrated Circuits, 1984, John Wiley and Sons, 3rd Edition, pp. 72–76.*
On–line posting of resume of Jianping Xu taken with dissertaion entitled "CMOS Stress Sensors on (111) Silicon", Aug. 2000 (http://www.eng.auburn.edu/~jaeger/students.html).*
News Article entitled "Virtual Silicon Valley Led by Universities" by Kenji Tsuda, AsiaBiz Tech (http://www.nikkeibp.asiabiztech.com/nea/200005/cojp__101029.html).*
El–Kareh, Fundamentals of Semiconductor Processing Technologies, 1995, Kluwer Acedemic Publishers, 3ʳᵈ Edition, pp. 23–25.*
Balasinski et al., "Fluorinated CMOSFETs Fabricated on (100) and (111) Si Substrates", 1993 VLSITSA, pp. 95–99.*
Gray & Meyer, Analysis and Design of Analog Integrated Circuits, pp. 72–76.*
Scott et al., "Chapter 10: CMOS VLSI Technology", from VLSI Handbook edited by Einspruch, 1985, Acedemic Press, pp. 121–125.*
Streetman, Solid State Electronic Devices, 1990, Prentice Hall, 3ʳᵈ Edition, p. 350.*

* cited by examiner

Primary Examiner—Michael J. Sherry
Assistant Examiner—Evan Pert
(74) Attorney, Agent, or Firm—Dickstein Shapiro Morin & Oshinsky LLP

(57) ABSTRACT

A method for forming NMOS and PMOS transistors that includes cutting a substrate along a (111) orientation and fabricating deep sub-micron NMOS and PMOS transistors thereon. The complementary NMOS and PMOS transistors form a CMOS transistor pair. The transistors are preferably used in structures such a memory circuits, e.g., DRAMs, which are, in turn, used in a processor-based system. Ideally, the deep sub-micron NMOS and PMOS transistors are operated in velocity saturation for optimal switching operation.

12 Claims, 11 Drawing Sheets

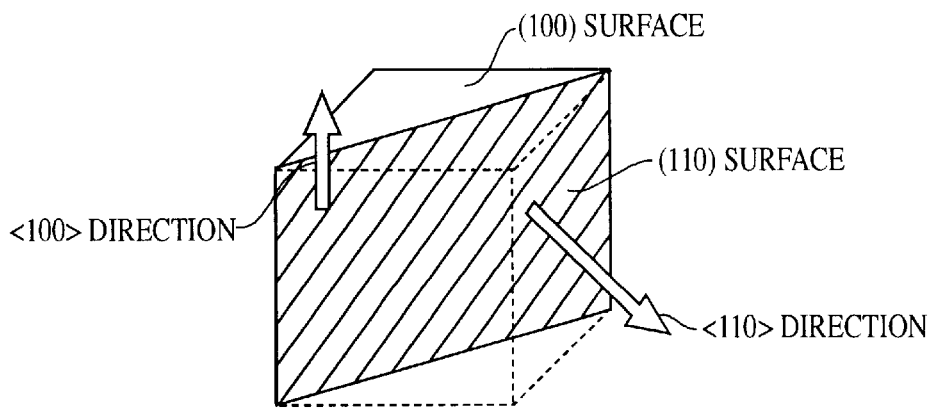
FIG. 1A
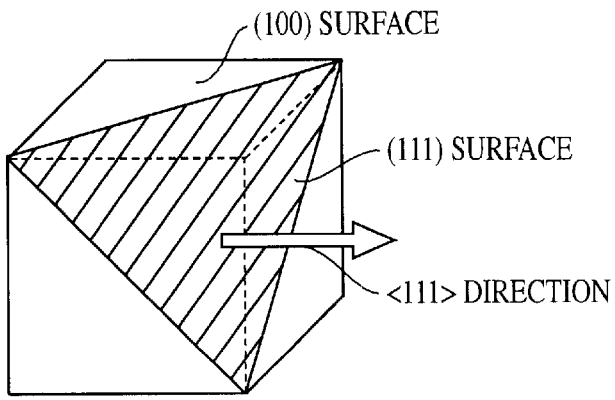
FIG. 1B
| SURFACE | Cs RELATIVE NUMBER OF ATOMS/UNIT AREA | TYPICAL SURFACE STATE DENSITIES OXIDE CHARGES | NORMAL REGION OF OPERATION SURFACE-HOLE MOBILITY $\mu_p\left(\frac{CM^2}{V \cdot SEC}\right)$ |
|---|---|---|---|
| (100) | 2 | $9 \times 10^{10}$ | 100 |
| (110) | $2\sqrt{2}$ | $2 \times 10^{11}$ | 250 <110><br>170 <100> |
| (111) |  | $5 \times 10^{11}$ | 180 |
(OLD TECHNOLOGY NUMBERS ARE NOW LOWER)
FIG. 1C

US 6,436,748 B1

METHOD FOR FABRICATING CMOS TRANSISTORS HAVING MATCHING CHARACTERISTICS AND APPARATUS FORMED THEREBY

BACKGROUND OF THE INVENTION

1. Field of the Invention

The present invention relates to a method for forming CMOS transistors having matching characteristics and the apparatus formed by the method. More particularly, the present invention relates to a method for forming the CMOS transistors in the (111) surface plane and enabling a velocity saturation of both transistors.

2. Description of the Related Art

Historically, (111) surface orientation wafers were the first mass produced for use in integrated circuit technology. Such orientations are the easiest and least expensive to produce and were still used until recently in bipolar circuit tecnology. Around 1970, however, MOS ("metal oxide semiconductor") technology changed to the currently used (100) surface orientation of the wafers. This change was made when NMOS ("n channel MOSFET") technology rather than PMOS ("p channel MOSFET") technology became common and before the advent of CMOS technology. FIGS. 1A–1B illustrate the surface planes (100) and (111) and (110) and <100> and <111> and <110> directions in a cubic crystalline structure, such as silicon, as discussed above, and FIG. 1C lists the relative number of atoms/unit area, the typical surface state densities and oxide charges, and the normal region of operation of surface-hole mobility of the different surfaces when employed in MOS technology.

An important development in the late 1960's was the one-transistor dynamic memory cell used in random access memories (the "DRAM"). A typical fabricated DRAM memory cell is pictured in FIG. 2. A DRAM cell, as pictured, is an integrated combination of a charge storage element (a capacitor or pn junction) and a MOSFET used as a switch. As shown in FIG. 2, the DRAM includes an n+drain 10 formed in p-type silicon 12. The capacitor or pn junction 14 is formed to the left of the access transistor 16. Polysilicon-1 18 and polysilicon-2 20 are formed in an intermediate oxide layer 22. An aluminum layer 24 is formed above the intermediate oxide layer 22.

As mentioned above, the 1970's saw the emergence of NMOS technology as preferred over PMOS technology. Routinely fabricated p-channel MOSFETs constructed in the standard configuration are ideally and practically enhancement mode devices, while n-channel MOSFETs are also ideally enhancement mode devices. However, because non-idealities tend to shift the threshold voltage toward negative biases, early NMOS transistors were typically of the depletion mode type. Until about 1977, this difference led to the domination of PMOS technology, that is, IC's ("integrated circuits") incorporating PMOS technology dominated the commercial marketplace. Subsequently, NMOS gained acceptance as it provides for a greater mobility of electrons relative to holes. NMOS technology is now incorporated into the majority of newly designed IC's.

The (100) surface orientation for wafers was chosen over the previously used (111) orientation due to its low surface state charge density on thermally oxidized surfaces, that is $9 \times 10^{10}/cm^2$ versus $5 \times 10^{11}/cm^2$. This was a particularly important consideration for NMOS technologies, which were gaining favor, in that high surface state charge density makes it more difficult to control active and parasitic device threshold voltages. Parasitic thresholds are no longer a concern with CMOS technology because of the high well dopings and/or channel stop surface implantation used. For (111) surfaces, the surface state charge density is less than $5 \times 10^{11}/cm^2$, which value is higher than that of the (100) surface. In present day technology, this would amount to less than a 0.25 V offset in active device threshold voltage and is readily compensated by the surface threshold voltage ion implantations.

A further benefit of NMOS devices was that the electron mobility in the inversion layers is greater on the (100) surfaces than on the other low order planes. However, it has been pointed out in U.S. Pat. No. 4,857,986 to Kinugawa that for modern day CMOS technology with sub-micron devices, a different set of tradeoffs exist. In such short-channel devices on (100) wafers, the NFETS largely operate in velocity saturation resulting in a source-to-drain current that is independent of orientation. On the other hand, as shown in FIGS. 3A and 3B, PFETS on (100) orientation wafers are less likely to be in velocity saturation and thus would benefit from optimizing the choice of crystal orientation around inversion layer hole mobility and other considerations such as the desirability of having matching transistors. This is clear from FIG. 3B, which depicts the drift velocity versus the electric field, as measured in V/cm. At the rightmost section of FIG. 3B, the drift velocity $v_d$ equals the saturation velocity $v_{sat}$. That is, the drift velocity saturates at high electric fields and thus becomes independent of the value of the electric field. To be more precise:

$$Vd = \frac{\mu_0 E}{\left[1 + \left(\frac{\mu_0 E}{v_{sat}}\right)^\beta\right]^{1/\beta}} = \begin{cases} \mu_0 E \ldots E \to 0 \\ v_{sat} \ldots E \to \infty \end{cases}$$

where $v_d$ is the drift velocity, $\beta$ is a constant depending upon whether you are dealing with holes or electrons, where $\beta=1$ for holes and $\beta=2$ for electrons in silicon, E is the electric field, $\mu_0$ to is the constant of proportionality between $v_d$ and E at low to moderate electric fields, and $v_{sat}$ is the limit or saturation velocity approached at high electric field values. FIG. 3B shows the desired operational points for both holes and electrons, with these points being below the velocity saturation E field value.

CMOS technology where the PMOS and NMOS transistors have matching characteristics would offer significant advantages. In current state-of-the-art CMOS technology on (100) crystal orientation orientations, the NMOS transistor has a much higher hole/electron mobility than the PMOS transistor. Even if the NMOS transistor is operating with velocity saturation, the PMOS transistor mobility on (100) surfaces is so low as to preclude velocity saturation. If the transistors are made the same size, then the switching characteristics are asymmetrical resulting in circuit timing problems and excess power distribution as depicted in FIGS. 4A–4B. FIG. 4A illustrates the time when both transistors are on. Note that the upslope time is greater than the downslope time, and thus the waveform is asymmetrical as are the current pulses shown in FIG. 4B. Not only does the asymmetrical switching slow circuit response, but a DC path exists from the power supply to ground during a significant portion of the slow switching transient resulting in excess power dissipation. If the PMOS transistors, as is often done, are made two to three times larger than the NMOS devices, then extra stray capacitances are introduced which tend to make efforts to improve the pull-up switching speed self defeating and to result in extra power dissipation. Moreover, such architecture does not effectively utilize chip area in circuit layouts.

SUMMARY OF THE INVENTION

The problems and disadvantages of the prior art have been addressed and mitigated by the present invention, which is directed to a method for forming NMOS and PMOS transistors on (111) crystal orientations, the transistors having matching characteristics, as well as the devices formed thereby. The method fabricates deep sub-micron CMOS ("Complementary Metal Oxide Semiconductor") transistors where the surface mobilities are comparable and high such that both the NMOS and PMOS transistors can operate with velocity saturation. Because the saturation velocity of both holes and electrons is close to $10^7$ cm/sec, both types of transistors will have similar current characteristics, or similar sized devices will have approximately equal drain current under similar voltage magnitudes.

The method includes the steps of cutting a wafer substrate along a (111) crystal plane and fabricating NMOS and PMOS transistors in the wafer substrate. CMOS technologies provide both n- and p-channel devices in one chip, at the expense of some increase in fabrication complexity and use of chip area as compared to simple NMOS transistors. The great advantage of CMOS digital circuits is that they may be designed for essentially zero power consumption in steady-state conditions for both logic states, i.e. off and on. Consequently, average power consumption is usually much smaller for CMOS than for NMOS devices. Silicon-gate CMOS offers significant improvements over metal-gate CMOS, which remains the cheapest form of CMOS. However, the present invention relies on silicon-gate CMOS, as this type of CMOS is particularly well-suited for LSI applications as it offers higher circuit density and higher speed performance.

The CMOS transistors formed by the present invention have the following composition. The CMOS transistors are fabricated as deep sub-micron devices on a (111) crystal plane orientation of a wafer. By deep sub-micron, it is meant that the size of the devices fabricated on the (111) surface are on the order of 0.5 microns in size or less.

Also, the present invention is directed to a DRAM or other memory circuit and memory module containing memory circuits formed with integrated circuits containing CMOS transistors fabricated on a (111) crystal plane orientation and to a processor based system employing such a memory module and/or memory circuit.

BRIEF DESCRIPTION OF THE DRAWINGS

These and other aspects, features and advantages of the present invention will become more apparent to one skilled in the art to which the present invention pertains through a study of the following detailed description, which is provided in conjunction with the appended drawings, all of which form a part of this specification, wherein:

FIGS. 1A and 1B are explanatory drawings showing the different surfaces and directions of a crystal structure;

FIG. 1C illustrates properties of those surfaces depicted in FIG. 1A and 1B;

DETAILED DESCRIPTION OF THE PRESENTLY PREFERRED EXEMPLARY EMBODIMENTS

Illustrative embodiments and exemplary applications will now be described with reference to the accompanying drawings.

Figure 5:
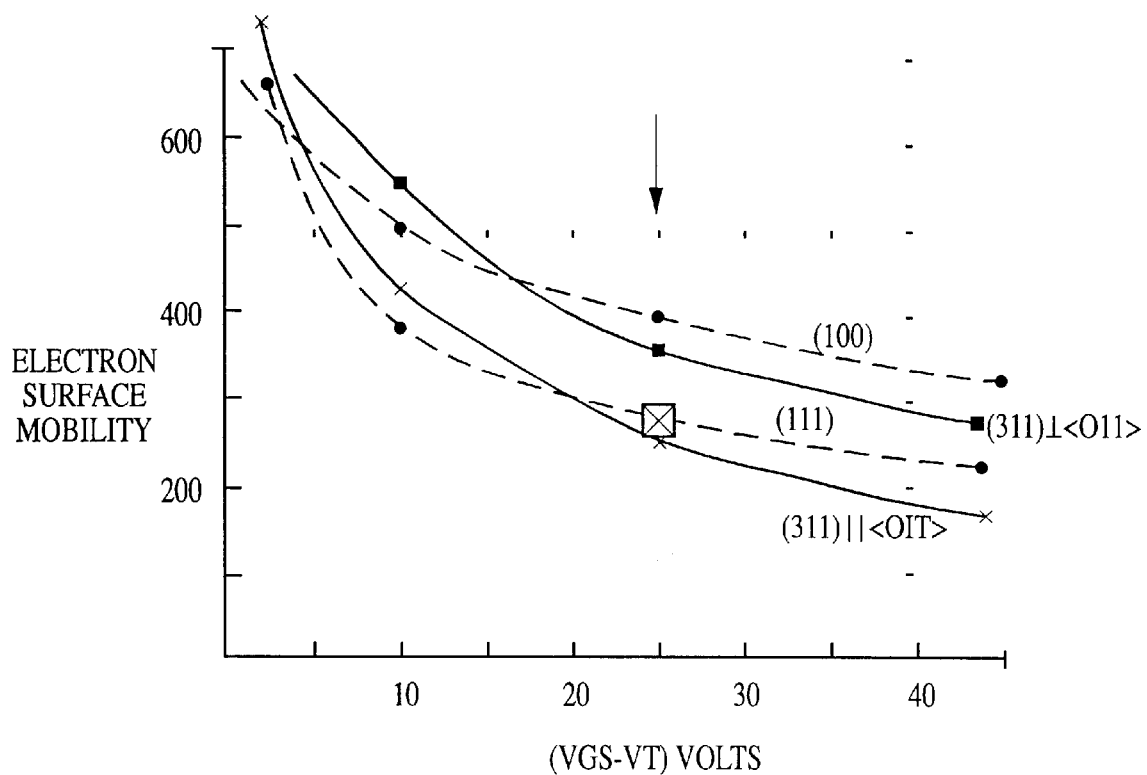
FIG. 5 illustrates the electron mobility within various crystal orientations, under typical vertical electric fields provided by a gate bias to be around 300 cm$^2$/V sec.
Figure 6:
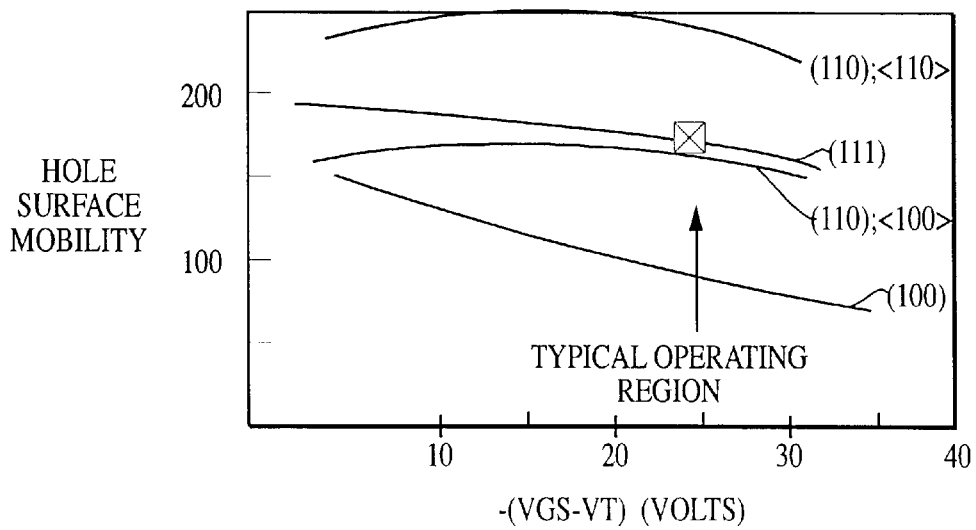
FIG. 6 illustrates the hole mobility within (111) orientations, under typical vertical electric fields provided by a gate bias to be around 200 cm$^2$/V sec.
Figure 7A:
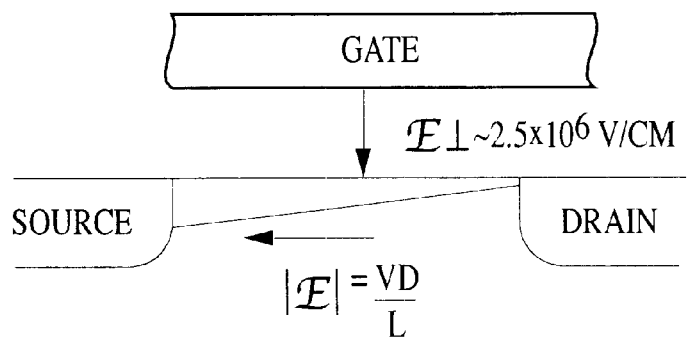
FIGS. 7A and 7B illustrate an estimate of the drift velocity of carriers in sub-micron CMOS devices on (111) surfaces.
Figure 7B:
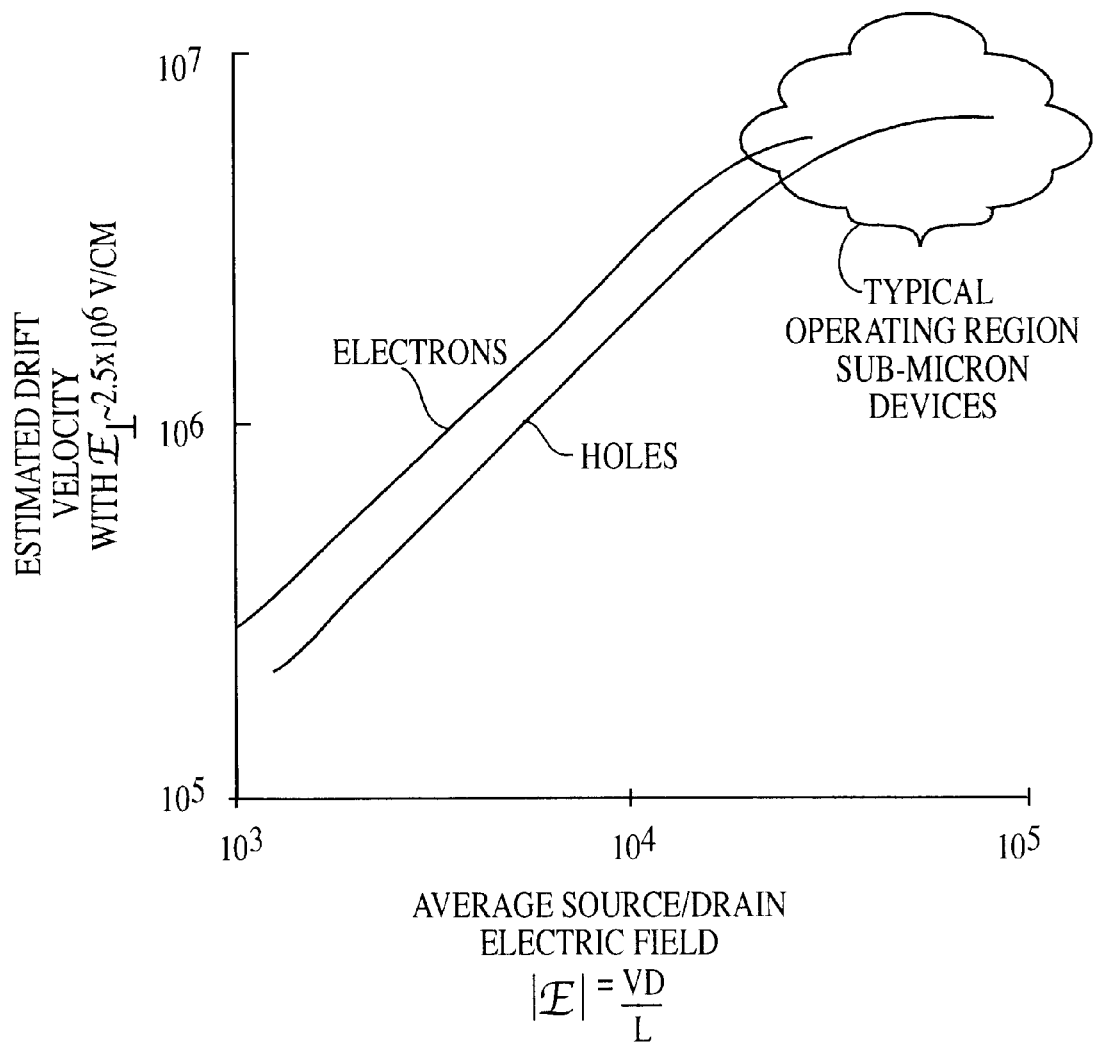

FIG. 5 illustrates the electron mobility of (111) silicon surfaces while FIG. 6 illustrates the hole mobility of (111) silicon surfaces, both under typical vertical electric fields due to the gate bias. The electron mobility is around 300 cm$^2$/V sec, which while lower than that on (100) surfaces, is still high enough to ensure velocity saturation on deep sub-micron devices, which might typically have drain to source electric fields of 1 V over 0.1 microns or $10^5$ V/cm. As shown in FIG. 5, inversion layer hole mobility can be 80% or higher on the (111) silicon surfaces, nearly 200 cm$^2$/V sec, than on the (100) surfaces. In the typical operating region, velocity saturation of holes will also occur for PMOS devices operated in the deep sub-micron region. Typical source-drain fields of $10^5$ V/cm and a mobility of 200 cm$^2$/Vsec will result in velocity saturation. An estimate of the drift velocity of carriers in deep sub-micron CMOS devices on (111) silicon surfaces is given in FIGS. 7A–7B. Both the NMOS and PMOS transistors on (111) surfaces and in deep sub-micron technology will then be operating with velocity saturation since the saturation velocity is the same, i.e., nearly $10^7$ cm/sec. The PMOS and NMOS transistors thus formed on a (111) surface will have matching or nearly identical current characteristics. Circuit performance is likewise improved by having the PMOS and NMOS transistors operating in the velocity saturation region and by them having matching characteristics. Basing deep sub-micron CMOS technology on a (111) surface oriented substrate wafer will provide improved circuit performance as well as a more efficient utilization of chip area.

Figure 8:
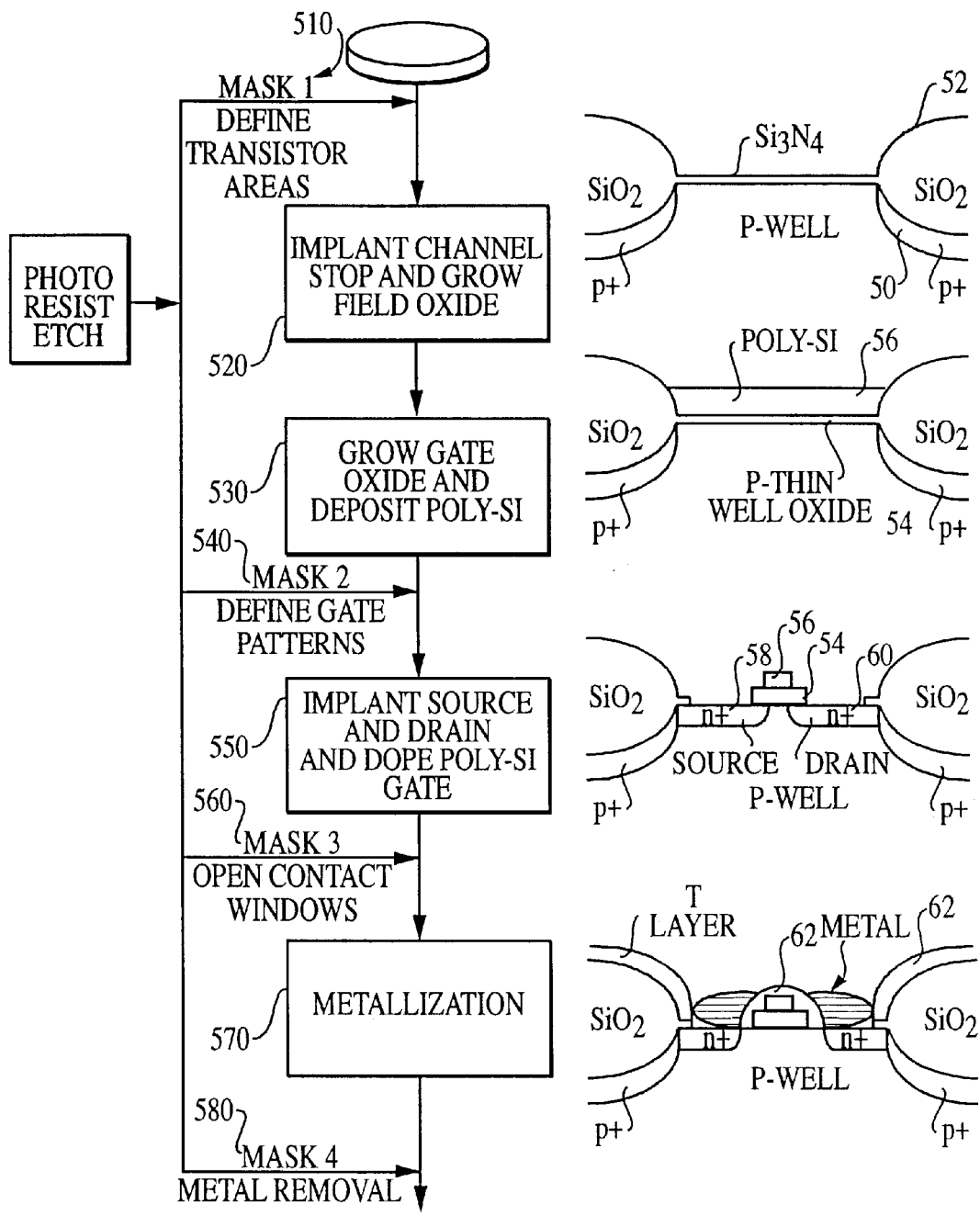
FIG. 8 illustrates a process by which the present invention may be implemented.

The NMOS and PMOS transistors are formed in a known manner. For example, they may be formed on the (111) surface of the silicon substrate by the process shown in FIG. 8. The essential steps of the process are spelled out below, but not all steps are shown or explained, as the process is a conventional one for forming transistors on a substrate. As shown in step S10, a first mask area is put down on the (111) silicon surface. This serves to define the transistor area. In step S20, the channel stop p+ is implanted and the field oxide e.g. $SiO_2$ 52 is grown, masked by a layer of $Si_3N_4$. In step S30, the gate oxide 54, e.g. $SiO_2$ is grown and Poly-Si 56 is deposited on the crystal orientation. The second mask is then put down on the wafer substrate in step S40. The second mask defines the gate patterns. In step S50, the source 58 and drain 60 are implanted and the gate Poly-Si 56 is doped. A passivation layer 62 of, e.g. $SiO_2$ is next applied. The third mask is deposited in step S60 to define the contact openings through layer 62. In step S70, a metal layer, e.g., aluminum, is laid down on the wafer. In step S80, the fourth mask is laid down upon the wafer in order to selectively remove the metal from areas where it is not desired. The above-described process is the simplest process for forming an NMOS transistor on the (111) surface. Other, more elaborate, processes are also available. A PMOS transistor can be likewise easily formed, but, of course, using complementary materials as well know in the art.

Figure 9:
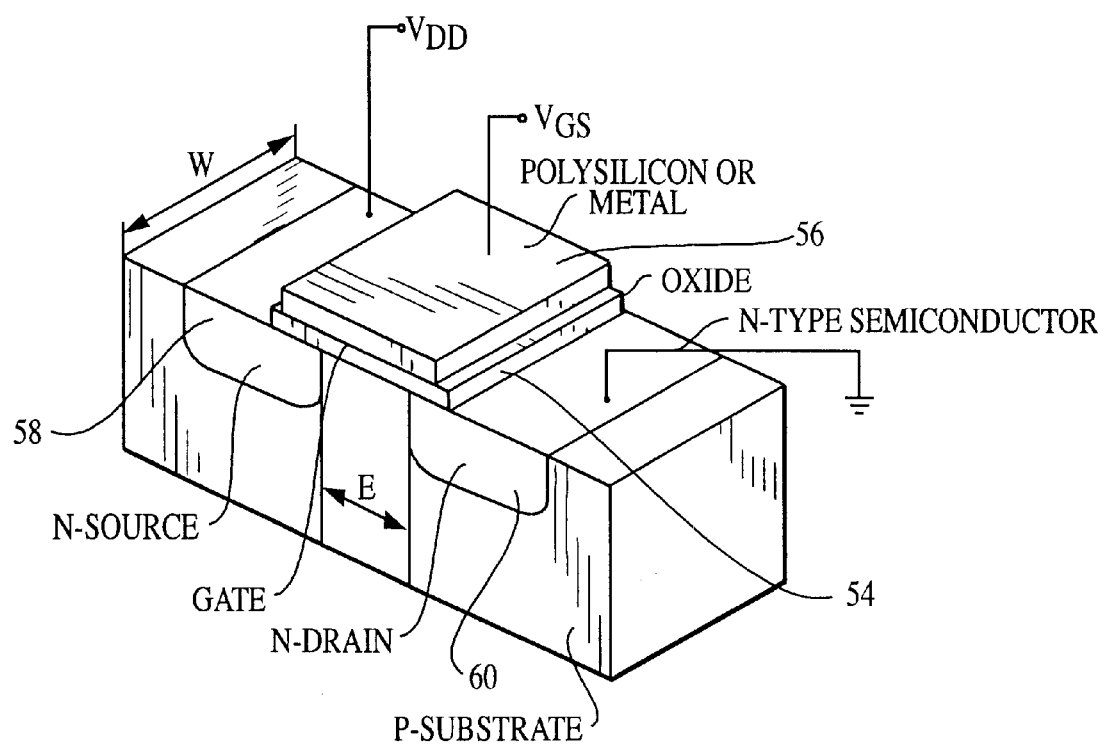
FIG. 9 depicts a transistor fabricated by the method according to the present invention.

The transistor formed on the (111) surface is a conventional NMOS or PMOS transistor. The basic structure of the resulting NMOS transistor is shown in FIG. 9. Biasing is provided by $V_{DD}$ and ground and a switching signal $V_{GS}$ is applied to the gate electrode. Preferably, the transistor is biased by operating in a velocity saturation mode. The PMOS structure differs from FIG. 9 by having p+ type semiconductor embedded in N type silicon, rather than n type semiconductor embedded in P type silicon. Biasing also occurs to push the PMOS transistor into velocity saturation.

Figure 10:
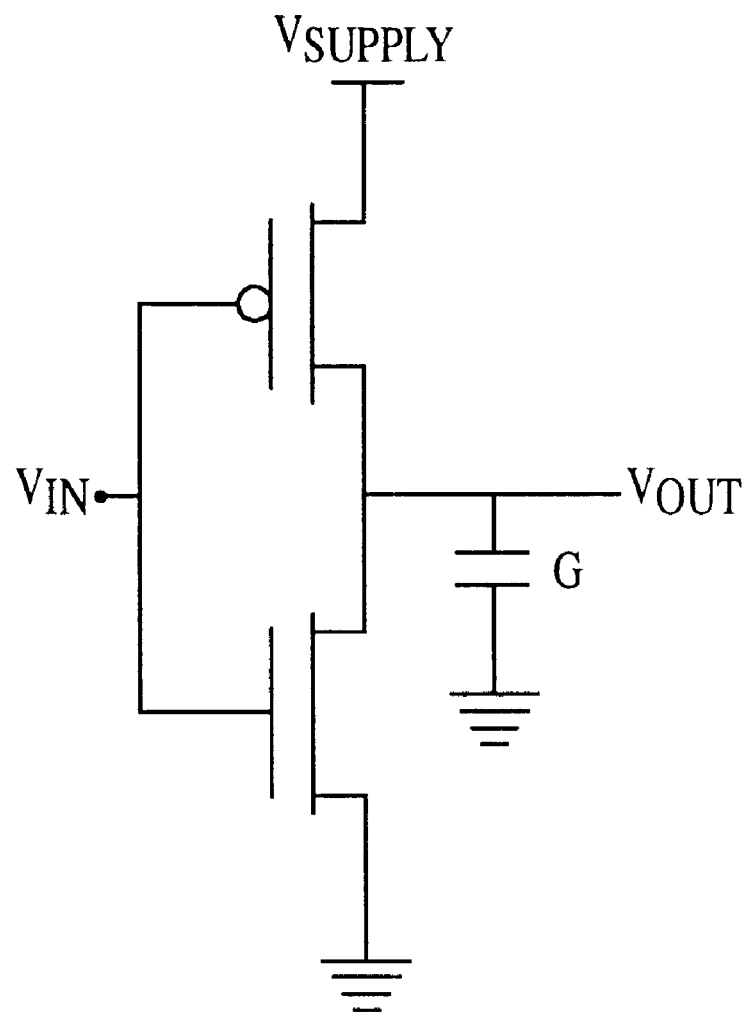
FIG. 10 illustrate one possible use of the present invention, as a CMOS inverter, and which may be used in a memory circuit, such as a DRAM circuit.

The thus-formed transistors may be used in logic circuits and address decode circuits, with both such circuits being typically used as peripheral circuits on a DRAM chip. The thus-formed transistors may also be used in DRAM sense amplifiers. However, the uses of the present invention are not limited to the above, rather these are merely exemplary uses of the present invention. As an example, a CMOS inverter as shown in FIG. 10 may be formed and used in the applications just described and elsewhere as well.

Figure 2:
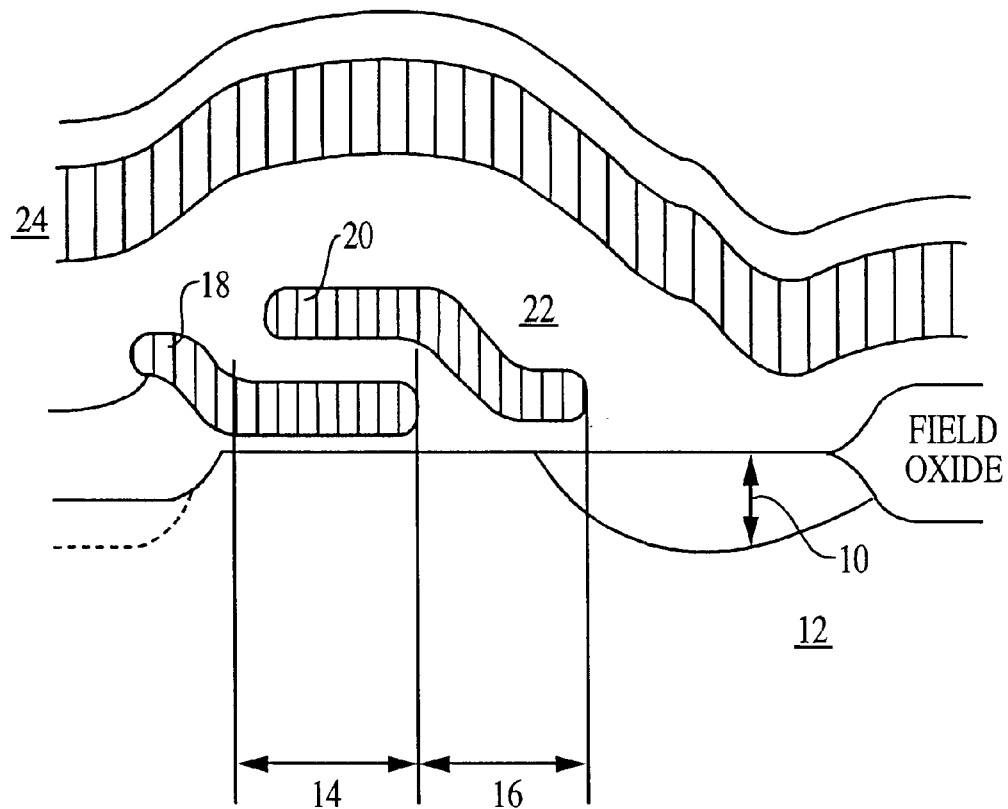
FIG. 2 illustrates a prior art fabricated DRAM cell.
Figure 3A:
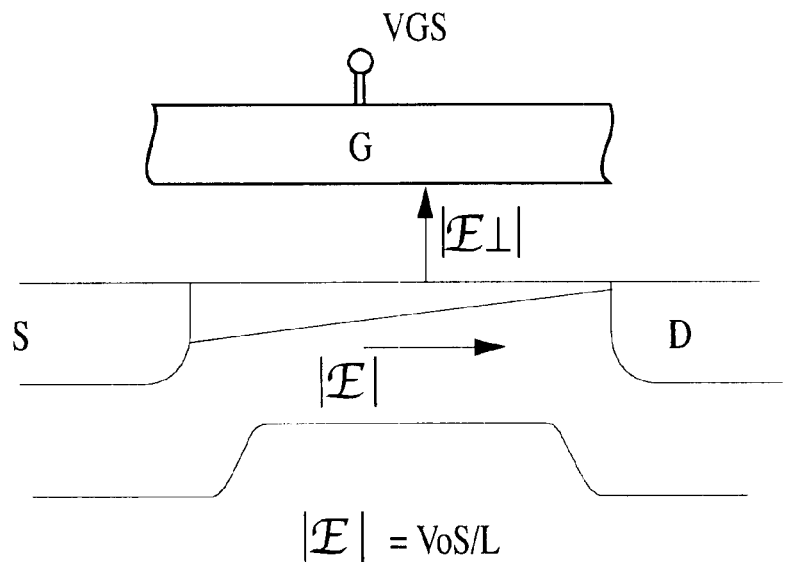
FIG. 3A is a drawing showing a prior art PFET transistor.
Figure 3B:
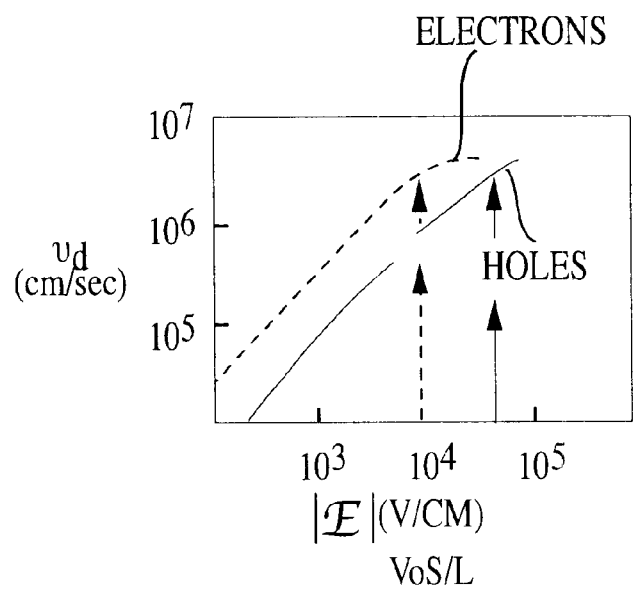
FIG. 3B is a graph of the drift velocity of carriers versus the average source-drain electric field of the PFET shown in FIG. 3A.
Figure 4A:
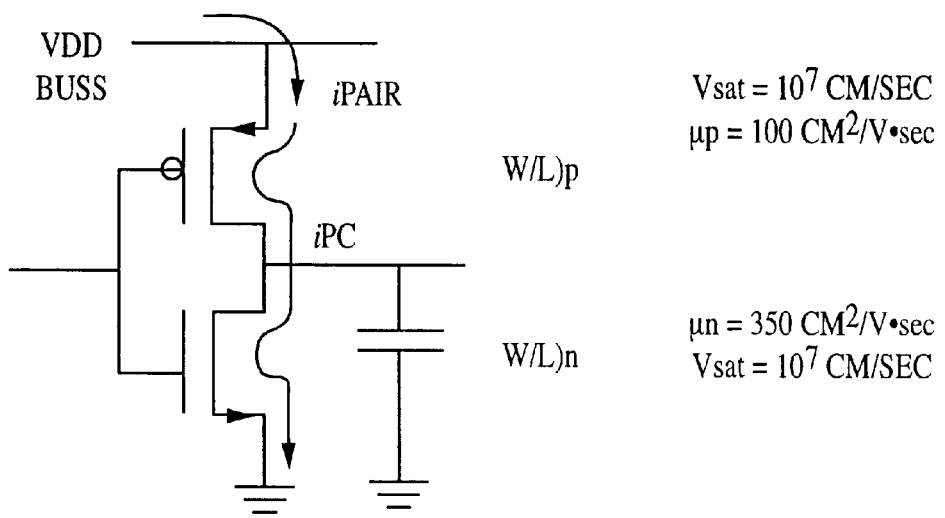
FIG. 4A illustrates a CMOS inverter circuit fabricated in a (100) crystal orientation.
Figure 4B:
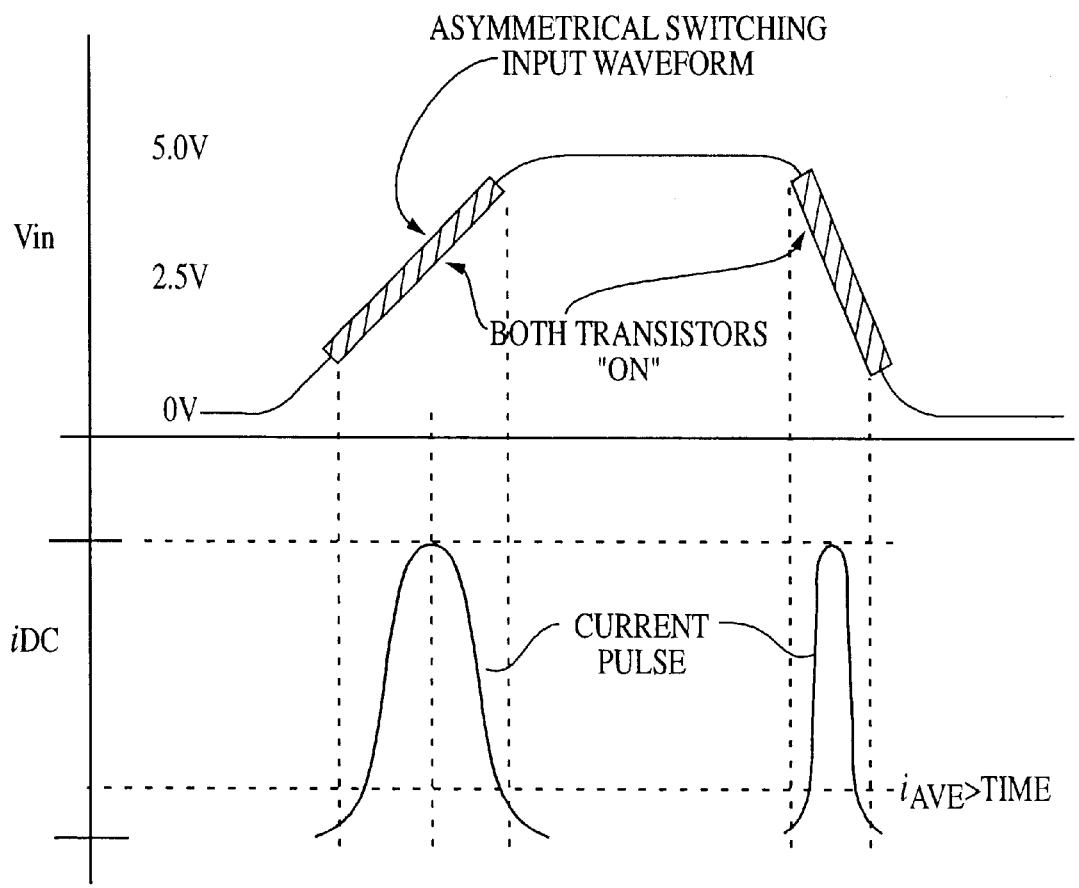
FIG. 4B is a diagram illustrating the asymmetrical switching of the NMOS and PMOS transistors of FIG. 4A of the same size on (100) crystal orientations.
Figure 11A:
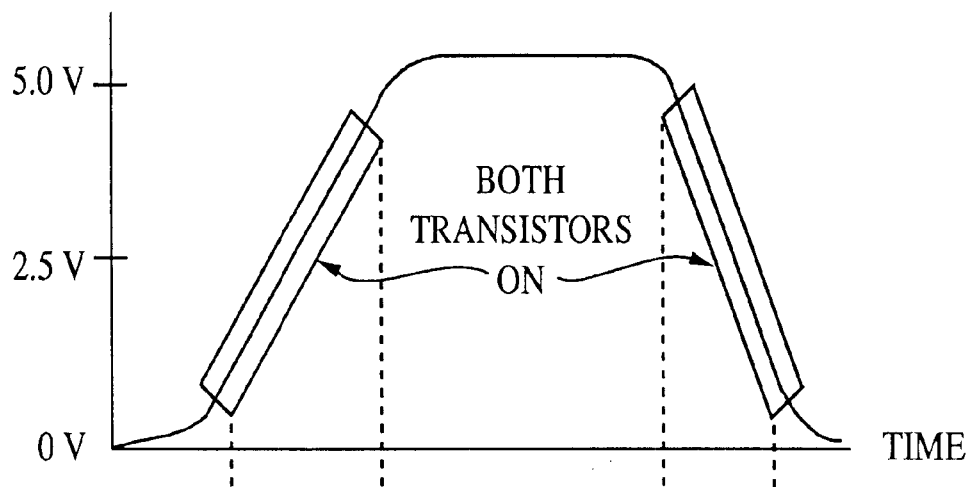
FIGS. 11A and 11B illustrate symmetrical switching, which is advantageous to the present invention.
Figure 11B:
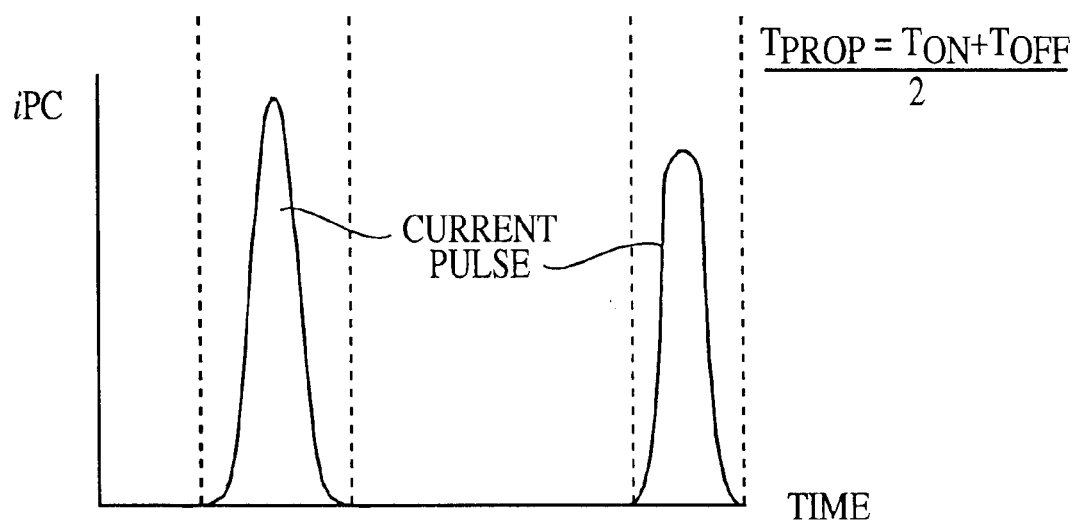

A particular application of the present invention is to provide in symmetrical switching of CMOS transistors of the same size formed on the (111) crystal surface. The present invention has advantages over the asymmetrical switching of CMOS transistors formed on the (100) surface shown in FIGS. 4A and 4B. The present invention allows for a smaller propagation delay or signal delay, with the delay being only $t_{prop}$ which is approximately equal to the sum of $t_{on}$ and $t_{off}$ divided by 2. This is shown in FIGS. 11A and 11B. Furthermore, the symmetrical switching achieved by the present invention results in lower power dissipation. There is less DC current due to the fact that the time period is shorter when both transistors are conducting. Also, the symmetric transistors that may be formed by the present invention make a more efficient utilization of the space on a chip than do those transistors formed on the (100) crystal orientation. In order to obtain symmetrical switching, shown in FIG. 11B, and to minimize delays in the transistors on the (100) surface would require that the PMOS transistors be made three times as large as the NMOS transistors, a requirement that directly leads to bigger chips rather than the smaller chips demanded by today's applications.

Figure 12:
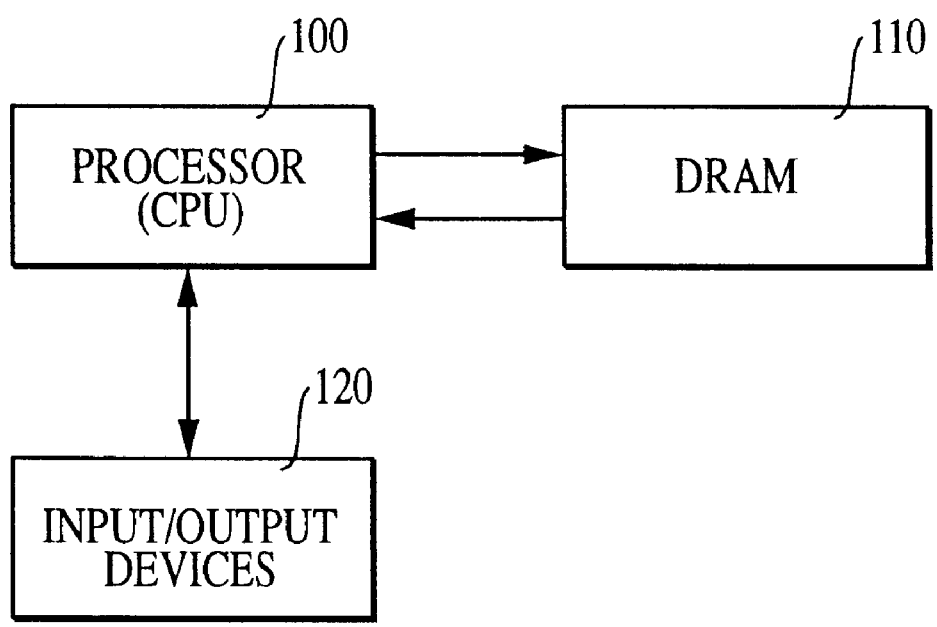
FIG. 12 shows a schematic diagram of a basic computer including a DRAM having CMOS transistors fabricated according to the present invention.

FIG. 12 illustrates a processor-based system, which includes a CPU 100, a DRAM 110, and input/output ("I/O") devices 120. The DRAM 110 includes peripheral circuits having NMOS and PMOS transistors fabricated in accordance with the method of the present invention. The transistors of the DRAM are formed on the (111) substrate surface.

While the present invention is described herein with reference to illustrative embodiments for particular applications, it should be understood that the invention is not limited thereto. Those having ordinary skill in the art and access to the teachings provided herein will recognize additional modifications, applications, embodiments and substitution of equivalents all fall within the scope of the invention. Accordingly, the invention is not to be considered as limited by the foregoing description, but instead is limited by the scope of the appended claims.

What is claimed is:

1. A method for fabricating an integrated circuit structure, said method comprising the steps of:

providing a substrate having a (111) surface; and fabricating at least one each of PMOS and NMOS transistors on said (111) surface;

wherein said PMOS and NMOS transistors are fabricated at less than 0.5 micron, have substantially matching switching characteristics and occupy substantially equal areas of said substrate.

2. A method as in claim 1, wherein said at least one each of said fabricated PMOS and NMOS transistors are paired to form at least one CMOS transistor pair.

3. A method as in claim 1, wherein said substrate is a silicon substrate.

4. An integrated circuit structure, comprising:

a silicon substrate having a (111) surface; and

NMOS and PMOS transistors formed on said (111) surface of said silicon substrate;

wherein said PMOS and NMOS transistors have substantially matching switching characteristics and occupy substantially equal areas of said silicon substrate, and wherein gate oxides of said PMOS and NMOS transistors do not include any fluorine atoms.

5. An integrated circuit structure as in claim 4, wherein at least one of each said NMOS and PMOS transistors are paired to form at least one CMOS transistor pair.

6. A method of operating an integrated circuit comprising:

providing an integrated circuit having PMOS and NMOS transistors fabricated in a (111) surface of a silicon substrate; and biasing said transistors to operate in a velocity saturation mode and with substantially matching switching characteristics.

7. A memory circuit comprising:

at least one pair of NMOS and PMOS transistors formed as a CMOS transistor pair on a (111) surface of a silicon substrate;

wherein said PMOS and NMOS transistors are fabricated at less than 0.5 micron, have substantially matching switching characteristics and occupy substantially equal areas of said silicon substrate.

8. A memory circuit as in claim 7, wherein said memory circuit is a DRAM memory circuit.

9. A memory circuit as in claim 7, wherein said CMOS transistor pair forms a CMOS inverter.

10. A processor-based system comprising:

a processor;

a memory device coupled to said processor, said memory device comprising at least one memory circuit, said memory circuit comprising:

a substrate having a (111) surface; and at least one pair of NMOS and PMOS transistors formed as a CMOS transistor pair fabricated on said (111) surface;

wherein said PMOS and NMOS transistors are fabricated at less than 0.5 micron, have substantially matching switching characteristics and occupy substantially equal areas of said silicon substrate.

11. A processor-based system as in claim 10, wherein said memory device is a DRAM.

12. A processor-based system as in claim 10, wherein said processor-based system is a computer system.

* * * * *

UNITED STATES PATENT AND TRADEMARK OFFICE
CERTIFICATE OF CORRECTION

PATENT NO. : 6,436,748 B1
DATED : August 20, 2002
INVENTOR(S) : Leonard Forbes et al.

It is certified that error appears in the above-identified patent and that said Letters Patent is hereby corrected as shown below:

Title page,
Item [56], OTHER PUBLICATIONS, Pierret, Modular Series… "Semiconductor Fundementals" should read -- Semiconductor Fundamentals --.
El-Kareh, Fundamentals of …, "Kluwer Acedemic" should read -- Kluwer Academic --.

Column 1,
Line 19, "tecnology" should read -- technology --.

Column 5,
Line 17, "know" should read -- known --.

Signed and Sealed this

Seventh Day of January, 2003

JAMES E. ROGAN
*Director of the United States Patent and Trademark Office*